Sept. 4, 1951

A. S. KHOURI ET AL 2,566,666

PRINTED ELECTRONIC CIRCUIT

Filed Feb. 13, 1948

INVENTORS
ALFRED S. KHOURI
ROBERT L. WOLFF
BY John W. Michael
ATTORNEY

Patented Sept. 4, 1951 2,566,666

UNITED STATES PATENT OFFICE 2,566,666

PRINTED ELECTRONIC CIRCUIT

Alfred S. Khouri and Robert L. Wolff, Milwaukee, Wis., assignors to Globe-Union Inc., Milwaukee, Wis., a corporation of Delaware Application February 13, 1948, Serial No. 8,054

2 Claims. (Cl. 323—74)

This invention relates to improvements in printed electronic circuits of the type including a capacitance and to the method of making the same.

Circuits of this general type are described in the April 1946 issue of Electronics in an article entitled "Printed Electronic Circuits," by Cledo Brunette and A. S. Khouri, and in National Bureau of Standards Circular 468, entitled "Printed Circuit Techniques," issued November 15, 1947, by United States Department of Commerce. They are also described and claimed in the pending application of George M. Ehlers et al., Serial No. 556,880, for "Electrical Circuit Component," assigned to Globe-Union Inc., assignee of this application. A special printed electronic circuit resistor-capacitor unit is described and claimed in the pending application of Alfred S. Khouri, Serial No. 768,734, now Patent No. 2,493,199, for "Electric Circuit Component," also assigned to Globe-Union Inc., assignee of this application. In such a unit the capacitor is a separate component utilizing a dielectric of high dielectric constant and is soldered to the base plate on which the circuiting is applied. In many cases it is advantageous to apply the capacitor plate areas and circuiting or other components to a single high dielectric constant base plate or to provide a desired capacitance as an inherent characteristic of the circuiting when so applied to a high dielectric constant base plate. This cannot be done in some applications without some portions of the circuiting adversely affecting the desired electrical functioning of the system due to undesirable capacitance effects.

It is the object of this invention, therefore, to provide a printed circuit including a desired capacitance which utilizes a base plate of relatively high dielectric constant material, the electrical performance of which will not be adversely affected because of undesired capacity effects to other components or conductive elements on the base plate.

This object can be accomplished by isolating or separating certain parts of the applied circuiting from the relatively high dielectric constant base plate on which other parts of the circuiting are applied. The isolation may be obtained by a separating layer of relatively low dielectric constant interposed between the high dielectric base plate and the parts of the circuiting to be isolated. The relatively high dielectric constant may vary from seventy to five thousand or over. The relatively low dielectric constant may vary from two to approximately ten. By this means the capacitance of various portions of the circuit may be readily controlled and the capacitance adversely affecting the electrical functioning of the system can be reduced to a desired or negligible value. The isolation layer is preferably a material of relatively low dielectric constant which will bond to the base and to which the circuiting and other components may be bonded to form a unitary integral structure of base plate, isolating layer, circuiting and other components. The isolating layer may be a vitreous enamel glaze which is bonded to the desired portions of the base plate before the circuiting or other components are applied or it may be made of resinous material which is applied after some of the circuiting has been applied.

Experiments have shown that the interposition of the isolating layer between a conductive element and the base plate causes the capacity between such conductive element and other conductors on the plate to be determined primarily by the dielectric constant and thickness of the isolating layer. In fact, intercapacitance of substantially 1000 micromicrofarads between adjacent conductors has been lowered to approximately 5.5 micromicrofarads by the interposition of isolating layers approximately .002 inch thick having a dielectric constant of substantially 5.

The novel features, which are considered characteristic of the invention, are set forth with particularity in the appended claims. The invention itself, however, both as to its organization and its method of operation, together with additional objects and advantages thereof, will be best understood from the following description of a specific embodiment when read in connection with the accompanying drawings, in which:

Figures 1, 2, 3, 4, 5, 6, 7:
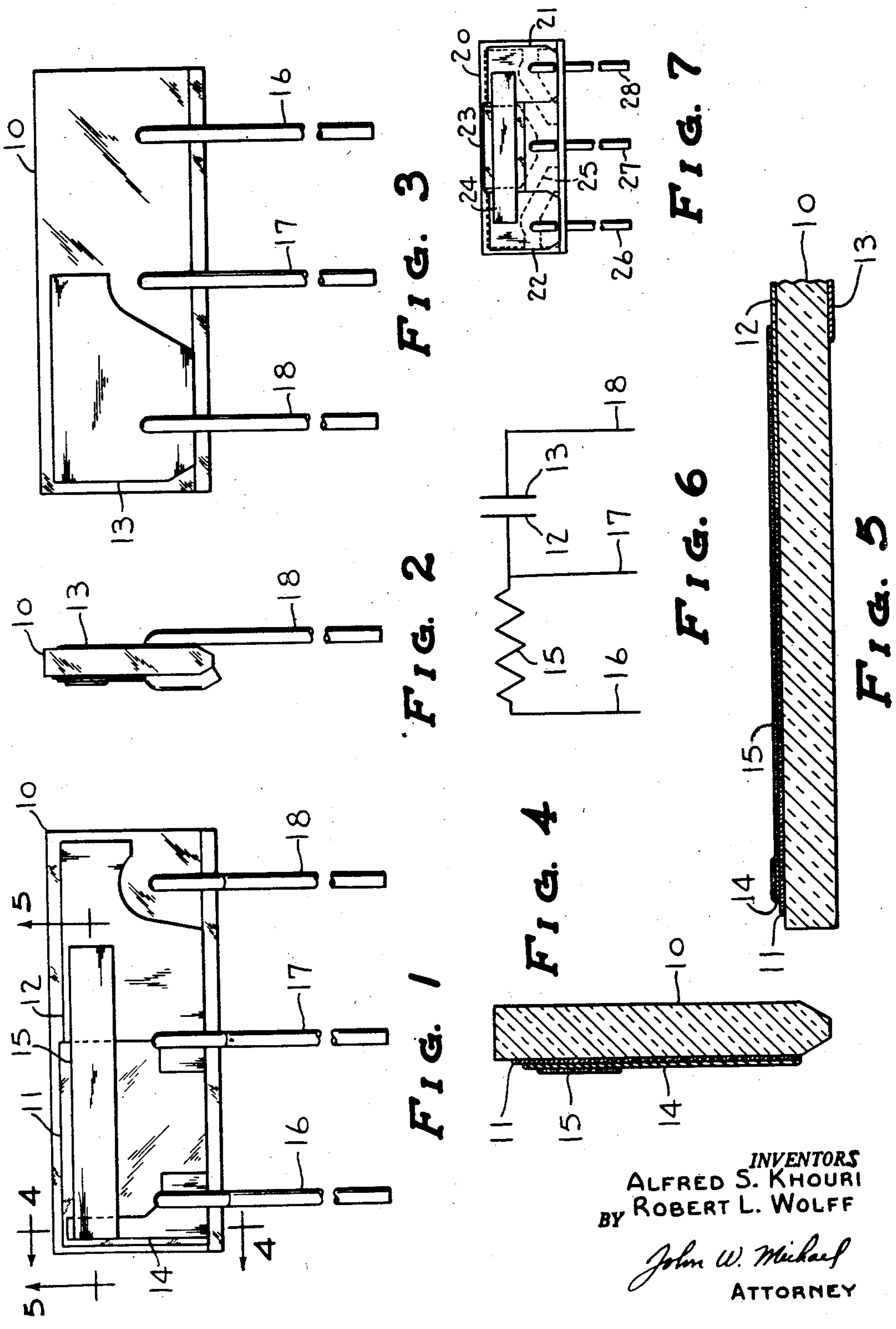
Fig. 1 is a view in front elevation of a printed electronic circuit embodying the present invention.
Fig. 2 is an end elevational view of Fig. 1.
Fig. 3 is a side elevational view of Fig. 2 showing the rear of Fig. 1.
Fig. 4 is an enlarged cross sectional view taken on the line 4—4 of Fig. 1.
Fig. 5 is an enlarged cross sectional view taken on the line 5—5 of Fig. 1.
Fig. 6 is a schematic diagram of the electronic circuit.
Fig. 7 is a view in front elevation of another printed electronic circuit embodying the present invention.

Referring to the drawings by reference numerals the printed electronic circuit embodying the invention is identified as a high impedance coupler. It may be used in radio circuits. The unit consists of a resistor and capacitance connected as shown in the wiring diagram of Fig. 6. The unit utilizes a base plate 10 which is a ceramic material having a high dielectric constant of seventy to five thousand or over. Various materials of high dielectric constant described in detail in U. S. Patent 2,398,088, issued April 9, 1946, to the assignee of this application, may be used. However, a ceramic made from a mixture of basically titanium dioxide with added materials, such as rare earths or various titanates, gives excellent results and is sufficiently strong and rigid to form the support for the unit. Substantially one half of the front side of the base plate 10 is coated with a layer 11 of vitreous enamel having a dielectric constant in the range of from two to approximately ten, and the plate is then fired to glaze and bond the layer. The capacitor plates 12, 13 and conductive element 14 are then applied in the locations shown. The application of the plates and conductive element may be done by a number of known methods. One such method is the known stencilled-screen process by which a conductive material containing silver is applied to the ceramic base plate. The plates 12 and 13 are applied to opposite sides of the base plate 10 and the conductive element 14 is applied to the isolating layer 11. The unit is then fired to bond the plates and conductive element to the ceramic base plate and layer respectively. A resistor 15 is then applied over the glaze 11 and extends over the conductive element 14 and capacitor plate 12 to form electrical connections therewith. The resistor film, as is known in this art, may be in the form of a paint containing carbon which is screened onto the surface of the isolating layer and conductive element and plate and then oven dried. External leads 16, 17 and 18 are then attached by a soldering method which does not affect the unit and its component parts. Lead 16 is connected to conductive element 14, lead 17 is connected to plate 12, and lead 18 is connected to plate 13 to complete a unit in which the capacitance from lead 16, conductive element 14, and resistor 15 to leads 17 and 18 and capacitors 12—13 is relatively low and does not adversely affect the electrical functioning of the system.

In some instances it may be desirable to utilize an isolating layer of resinous material having a low dielectric constant. When this is done in the type of unit heretofore described, the capacitor plates 12 and 13 are first applied and fired. Then the isolating layer 11 of resinous material is applied and baked to bond it to the base plate. The separating layer may be a phenolic resin. The type of resin, however, depends to a considerable extent upon the type of binder used in making the resistor. For example, if a silicone resin is used as the binder for the resistor, it may be desirable to apply a layer of silicone resin. In any event, the resin layer used must have a relatively low dielectric constant of from two to approximately ten as compared to the high dielectric constant of the base plate 10. Thereafter the conductive element 14 is applied and fired at a relatively low temperature so as not to disturb the characteristics of the resinous layer. Because the leads cannot be readily soldered to the low temperature silver they can be attached by some mechanical means. For example, an eyelet may be passed through the base plate and riveted over the base of the conductive element. The lead may then be soldered to the eyelet. The resistor 15 is then applied as previously described.

A unit of the resinous type, wherein all the conductive elements and capacitor plates may be applied and fired before the isolating layer is applied to the base, is shown in Fig. 7. In this embodiment the capacitor plates 21 and 22 are applied to the front of the base plate 20 and the combined capacitor plates-conductive element 25 is applied to the rear of such plate and then the unit is fired at high temperature to make a close bond. Thereafter the resinous isolating layer 23 is applied and the resistor 24 applied over it and plates 21 and 22 to electrically connect such plates. The plates and conductive element being of high temperature silver, the leads 26, 27 and 28 may be soldered as before described.

While several embodiments of the invention have been shown and described herein it is to be understood that the details of procedures, the arrangement of parts, the proportion of ingredients and like factors may be considerably varied and other modifications of the unit covered without departing from the spirit of the invention and the scope of the following claims.

We claim:

1. An electrical circuit unit for use in circuits for electric devices comprising a rigid body of ceramic material of relatively high dielectric constant suitable for the insulation of high frequency electric circuits and forming the primary structural support for the unit, plural impedance elements electrically connected in an electrical circuit bonded to said body and including a resistance element and a fixed capacitance, said capacitance having its plates as conductive coatings on and bonded to opposite surfaces of said body whereby the high dielectric constant of said body produces the maximum capacitance for said fixed capacitance, said resistance element being disposed on a surface of said body carrying one of the plates of said capacitance and being electrically connected to said one plate, and an isolating layer of relatively low dielectric constant material imposed between said resistance element and said body whereby the low dielectric constant of said layer offsets the high dielectric constant of said body to minimize the undesirable capacitative coupling between electrically conductive portions of said circuit.

2. The electrical circuit unit described in claim 1 wherein electrically conducting leads are provided for said unit, and are connected respectively to opposite ends of said resistance element and to that plate of the capacitance which is insulated from said resistance element by said body.

ALFRED S. KHOURI.
ROBERT L. WOLFF.

REFERENCES CITED

The following references are of record in the file of this patent:

UNITED STATES PATENTS

| Number | Name | Date |
|---|---|---|
| 1,775,276 | Ferguson | Sept. 9, 1930 |
| 2,441,960 | Eisler | May 25, 1948 |

FOREIGN PATENTS

| Number | Country | Date |
|---|---|---|
| 566,986 | Great Britain | Jan. 23, 1945 |